(12) United States Patent
Moon et al.

(10) Patent No.: US 12,237,842 B2
(45) Date of Patent: Feb. 25, 2025

(54) APPARATUSES AND METHODS FOR FAST ANALOG-TO-DIGITAL CONVERSION

(71) Applicant: Samsung Electronics Co., Ltd., Suwon-si (KR)

(72) Inventors: Daesik Moon, Suwon-si (KR); Youngcheol Chae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 181 days.

(21) Appl. No.: 18/148,510

(22) Filed: Dec. 30, 2022

(65) Prior Publication Data

US 2023/0216516 A1    Jul. 6, 2023

(30) Foreign Application Priority Data

Jan. 3, 2022   (KR) .................. 10-2022-0000508

(51) Int. Cl.
*H03M 1/10*   (2006.01)
*H03M 1/14*   (2006.01)
*H03M 1/18*   (2006.01)

(52) U.S. Cl.
CPC ......... *H03M 1/147* (2013.01); *H03M 1/1009* (2013.01); *H03M 1/183* (2013.01)

(58) Field of Classification Search
CPC ..... H03M 1/147; H03M 1/1009; H03M 1/183
USPC ........................................ 341/155, 120, 122
See application file for complete search history.

(56) References Cited

U.S. PATENT DOCUMENTS

| | | | | |
|---|---|---|---|---|
| 5,892,472 A | * | 4/1999 | Shu ................ | H03M 1/183 |
| | | | | 341/139 |
| 6,611,163 B1 | * | 8/2003 | Mukherjee ........... | H03K 5/249 |
| | | | | 327/91 |
| 7,649,486 B2 | | 1/2010 | Toyomura et al. | |
| 7,928,872 B2 | | 4/2011 | Nakajima | |
| 8,063,811 B2 | | 11/2011 | Hojabri et al. | |
| 8,362,938 B2 | | 1/2013 | Cho et al. | |
| 9,252,800 B1 | * | 2/2016 | Park ................ | H03M 1/20 |
| 9,356,616 B1 | | 5/2016 | Pan et al. | |
| 2015/0061780 A1 | * | 3/2015 | Bode ................ | H03K 4/50 |
| | | | | 331/25 |

FOREIGN PATENT DOCUMENTS

| KR | 101248485 B1 | 4/2013 |
|---|---|---|
| KR | 101352767 B1 | 2/2014 |
| KR | 101419804 B1 | 7/2014 |
| KR | 101590480 B1 | 2/2016 |

* cited by examiner

*Primary Examiner* — Peguy Jean Pierre
(74) *Attorney, Agent, or Firm* — Myers Bigel, P.A.

(57) ABSTRACT

An apparatus configured to convert an analog input signal into a digital output signal may include a first amplification circuit configured to receive the analog input signal and a plurality of reference voltages and amplify differences between the analog input signal and the plurality of reference voltages; a plurality of first capacitors configured to respectively store charges corresponding to signals outputted by the first amplification circuit; a second amplification circuit configured to amplify differences among voltages of the plurality of first capacitors; a plurality of second capacitors configured to respectively store charges corresponding to signals outputted by the second amplification circuit; and a comparison circuit configured to generate the digital output signal by comparing voltages of the plurality of second capacitors with each other.

18 Claims, 13 Drawing Sheets

APPARATUSES AND METHODS FOR FAST ANALOG-TO-DIGITAL CONVERSION

CROSS-REFERENCE TO RELATED APPLICATION

This application is based on and claims priority under 35 U.S.C. § 119 to Korean Patent Application No. 10-2022-0000508, filed on Jan. 3, 2022, in the Korean Intellectual Property Office, and the entire contents of the above-identified application are incorporated by reference herein.

TECHNICAL FIELD

The present disclosure relates to analog-to-digital conversion, and more particularly, to apparatuses and methods for fast analog-to-digital conversion.

BACKGROUND

An analog-to-digital converter (ADC) may be used for various applications. Some applications may require or desire a high accuracy in analog-to-digital conversion, and may include an ADC having a high resolution. Some applications may require or desire a high speed in analog-to-digital conversion, and may include an ADC having a high sampling speed. In some instances, such as an ADC used in a sensor for an automotive application, e.g., autonomous driving, the ADC may be required or desired to have not only a high accuracy but also a high operation speed.

SUMMARY

The present disclosure may provide apparatuses and methods for fast analog-to-digital conversion, and may provide for calibration of analog-to-digital converters.

According to some aspects of the inventive concept, an apparatus configured to convert an analog input signal into a digital output signal may be provided. The apparatus may include: a first amplification circuit configured to receive the analog input signal and a plurality of reference voltages and configured to amplify differences between the analog input signal and the plurality of reference voltages; a plurality of first capacitors configured to respectively store charges corresponding to signals outputted by the first amplification circuit; a second amplification circuit configured to amplify differences among voltages of the plurality of first capacitors; a plurality of second capacitors configured to respectively store charges corresponding to signals outputted by the second amplification circuit; and a comparison circuit configured to generate the digital output signal by comparing voltages of the plurality of second capacitors with each other.

According to some aspects of the inventive concepts, an apparatus configured to convert an analog input signal into a digital output signal may be provided. The apparatus may include a first amplification circuit configured to amplify differences between the analog input signal and a plurality of reference voltages during a first phase of a clock signal; a second amplification circuit configured to amplify differences among signals outputted by the first amplification circuit during a second phase of the clock signal; and a comparison circuit configured to generate the digital output signal by comparing signals outputted by the second amplification circuit with each other during the first phase of the clock signal.

According to some aspects of the inventive concepts, a method of converting an analog input signal into a digital output signal may be provided. The method may include: receiving the analog input signal and a plurality of reference voltages; generating first output signals by amplifying differences between the analog input signal and the plurality of reference voltages; storing charges corresponding to the first output signals in a plurality of first capacitors; generating second output signals by amplifying differences among voltages of the plurality of first capacitors; storing charges corresponding to the second output signals in a plurality of second capacitors; and generating the digital output signal by comparing voltages of the plurality of second capacitors with each other.

BRIEF DESCRIPTION OF THE DRAWINGS

Some examples of embodiments of the inventive concepts will be more clearly understood from the following detailed description taken in conjunction with the accompanying drawings in which.

DETAILED DESCRIPTION

Figure 1:
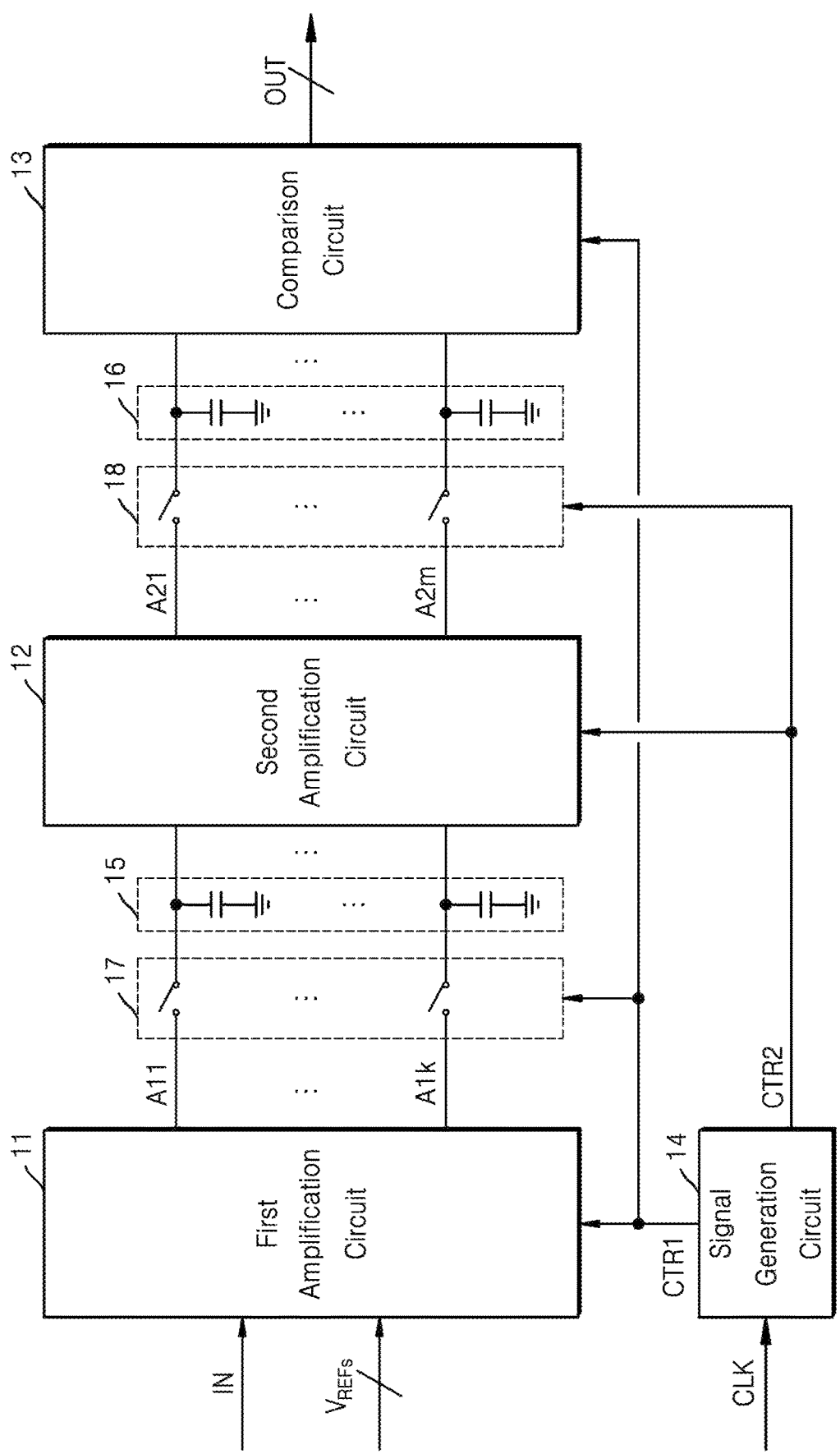
FIG. 1 is a block diagram of an analog-to-digital converter (ADC) according to some example embodiments.

FIG. 1 is a block diagram of an analog-to-digital converter (ADC) 10 according to some example embodiments. Here, the ADC 10 may refer to an apparatus for analog-to-digital conversion. In some embodiments, the ADC 10 may be manufactured by semiconductor processes. In some embodiments, the ADC 10 may be independently included in a single package, while in other embodiments the ADC 10 may be integrated with other circuits into a single package. In some embodiments, elements of the ADC 10 may be included in at least two packages, and the ADC 10 may include a board on which the at least two packages are mounted.

Referring to FIG. 1, the ADC 10 may convert an analog input signal IN into a digital output signal OUT. The ADC 10 may receive a plurality of reference voltages $V_{REFs}$ and convert the analog input signal IN into the digital output signal OUT based on the reference voltages $V_{REFs}$. The reference voltages $V_{REFs}$ may have respective and sequentially increasing magnitudes, and the digital output signal OUT may have a value corresponding to the magnitude of the analog input signal IN. For example, the digital output signal OUT may correspond to a thermometer code and include ones (1s) or zeroes (0s) corresponding to the magnitude of the analog input signal IN. In some embodiments, the ADC 10 may include a converter that converts the digital output signal OUT corresponding to a thermometer code into a binary digital signal. As shown in FIG. 1, the ADC 10 may include a first amplification circuit 11, a second amplification circuit 12, a comparison circuit 13, a signal generation circuit 14, a plurality of first capacitors 15, a plurality of second capacitors 16, a plurality of first switches 17, and a plurality of second switches 18.

The first amplification circuit 11 may receive the analog input signal IN and the reference voltages $V_{REFs}$ and may generate a plurality of first output signals A11 to A1k, where "k" is an integer that is greater than 1. For example, the first amplification circuit 11 may generate the first output signals A11 to A1k by amplifying differences between the analog input signal IN and the reference voltages $V_{REFs}$. In other words, a first of the first output signals A11 may correspond to a difference between the analog input signal IN and one of the reference voltages $V_{REFs}$ (e.g., a first of the reference voltages $V_{REFs}$). As shown in FIG. 1, the first amplification circuit 11 may receive a first control signal CTR1 and may operate based on the first control signal CTR1. For example, the first amplification circuit 11 may precharge outputs in response to the first control signal CTR1 being deactivated or indicating a deactivated state or first state, and the first amplification circuit 11 may perform amplification in response to the first control signal CTR1 being activated or indicating an activated state or second state. An example of the first amplification circuit 11 will be described with reference to FIG. 2 below.

As an ADC for fast conversion, a flash ADC may sample an analog input using a switched capacitor and compare a sampled voltage with a reference voltage. Such a track-and-hold operation may cause noise, and there may be a limit to increasing a sampling frequency, in part because the track-and-hold operation and a subsequent comparison operation need to be completed in a sampling period. However, as shown in FIG. 1, the first amplification circuit 11 of the ADC 10 may directly receive the analog input signal IN and amplify differences between the analog input signal IN and the reference voltages $V_{REFs}$. Accordingly, track-and-hold (e.g., a track-and-hold operation) may be omitted, and a signal amplified from the analog input signal IN may be stored as described below. Accordingly, the noise characteristic of the ADC 10 may be improved.

The first capacitors 15 may respectively store charges corresponding to the outputs, i.e., the first output signals A11 to A1k, of the first amplification circuit 11. For example, while the first amplification circuit 11 is performing amplification, the first switches 17 may be turned on in response to the first control signal CTR1 being activated or indicating the activated state, and charges corresponding to the first output signals A11 to A1k may be respectively stored in the first capacitors 15. In some embodiments, as described below with reference to FIG. 3 and the like, the first capacitors 15 may be precharged with a certain voltage, e.g., $V_{RST}$, before storing the charges corresponding to the first output signals A11 to A1k.

The second amplification circuit 12 may be connected to the first capacitors 15. The second amplification circuit 12 may amplify differences among respective voltages of the first capacitors 15 and generate a plurality of second output signals A21 to A2m, where "m" is an integer that is greater than 1. As described below with reference to FIG. 4, the amplification operation of the second amplification circuit 12 may follow the amplification operation of the first amplification circuit 11. As shown in FIG. 1, the second amplification circuit 12 may receive a second control signal CTR2 and may operate based on the second control signal CTR2. For example, the second amplification circuit 12 may precharge outputs in response to the second control signal CTR2 being deactivated or indicating a deactivated state or first state and perform amplification in response to the second control signal CTR2 being activated or indicating an activated state or second state. An example of the second amplification circuit 12 will be described with reference to FIG. 2 below.

The second capacitors 16 may respectively store charges corresponding to the outputs, i.e., the second output signals A21 to A2m, of the second amplification circuit 12. For example, while the second amplification circuit 12 is performing amplification, the second switches 18 may be turned on in response to the second control signal CTR2 being activated, and charges corresponding to the second output signals A21 to A2m may be respectively stored in the second capacitors 16. In some embodiments, as described below with reference to FIG. 3, the second capacitors 16 may be precharged with a certain voltage, e.g., a reset voltage $V_{RST}$, before storing the charges corresponding to the second output signals A21 to A2m.

The comparison circuit 13 may be connected to the second capacitors 16. The comparison circuit 13 may compare respective voltages of the second capacitors 16 with each other and generate the digital output signal OUT. In other words, to generate the digital output signal OUT, the comparison circuit 13 may compare, e.g., at least a first voltage of a first of the second capacitors 16 with at least a second voltage of a second of the second capacitors 16. As described below with reference to FIG. 4 and the like, the comparison operation of the comparison circuit 13 may follow the amplification operation of the second amplification circuit 12 and may be performed in parallel with the amplification operation of the first amplification circuit 11. Accordingly, the operations, e.g., the amplification operations and the comparison operation, of the ADC 10 may be pipelined, and the ADC 10 may provide a high sampling frequency. As shown in FIG. 1, the comparison circuit 13 may receive the first control signal CTR1 and operate based on the first control signal CTR1. For example, the comparison circuit 13 may compare inputs (or amplify a difference between inputs) in response to the first control signal CTR1 being deactivated or in the first state and latch a comparison result in response to the first control signal CTR1 being activated or in the second state. An example of the comparison circuit 13 will be described with reference to FIG. 2 below.

In some embodiments, the first capacitors 15 and the second capacitors 16 may correspond to parasitic capacitors. For example, the ADC 10 may not include independent elements designed for the first and second capacitors 15 and 16, but the first and second capacitors 15 and 16 may be implemented by parasitic capacitors created by patterns in the layout of the ADC 10. In some embodiments, the ADC 10 may include patterns that are designed such that the first and second capacitors 15 and 16 have desired capacitances. Here, a capacitor may refer to not only a capacitor that is designed as an independent element but also a parasitic capacitor providing parasitic capacitance.

The signal generation circuit 14 may receive a clock signal CLK and generate the first and second control signals CTR1 and CTR2 based on the clock signal CLK. As shown in FIG. 1, the first control signal CTR1 may be provided to the first switches 17, and the first switches 17 may be turned on in response to the first control signal CTR1 being activated and turned off in response to the first control signal CTR1 being deactivated. The second control signal CTR2 may be provided to the second switches 18, and the second switches 18 may be turned on in response to the second control signal CTR2 being activated and turned off in response to the second control signal CTR2 being deactivated. In some embodiments, the signal generation circuit 14 may include a plurality of logic gates. For the pipeline described above, the signal generation circuit 14 may generate the first and second control signals CTR1 and CTR2 such that the control signals CTR1 and CTR2 are mutually exclusively activated within a period of the clock signal CLK. In other words, the first control signal CTR1 may be activated for a first portion of the period of the clock signal CLK, and the second control signal CTR2 may be activated for a second portion of the period of the clock signal CLK. In some embodiments, the signal generation circuit 14 may generate additional control signals based on the clock signal CLK. In some embodiments, the signal generation circuit 14 may additionally output signals, which are generated by inverting control signals. Examples of operations of the signal generation circuit 14 will be described with reference to FIG. 4 below.

Here, a switch may be turned on in response to an activated control signal (or a control signal indicating a first state) and turned off in response to a deactivated control signal (or the control signal indicating a second state). The switch may electrically connect both ends thereof in an on-state and electrically disconnect the both ends thereof in an off-state. The switch may have a certain structure. For example, the switch may include a single transistor, which has a control electrode receiving a control signal, or the switch may include at least two transistors, which are connected in series and/or in parallel to each other. Herein, some "electrically connected elements" may be simply referred to as "connected elements." In addition, it is assumed herein that the control signal is an active high signal. Accordingly, the activated control signal may be at a high level, and the deactivated control signal may be at a low level. It is understood that the present disclosure is not limited as such, and in some embodiments, the control signal may be an active low signal.

Figure 2:
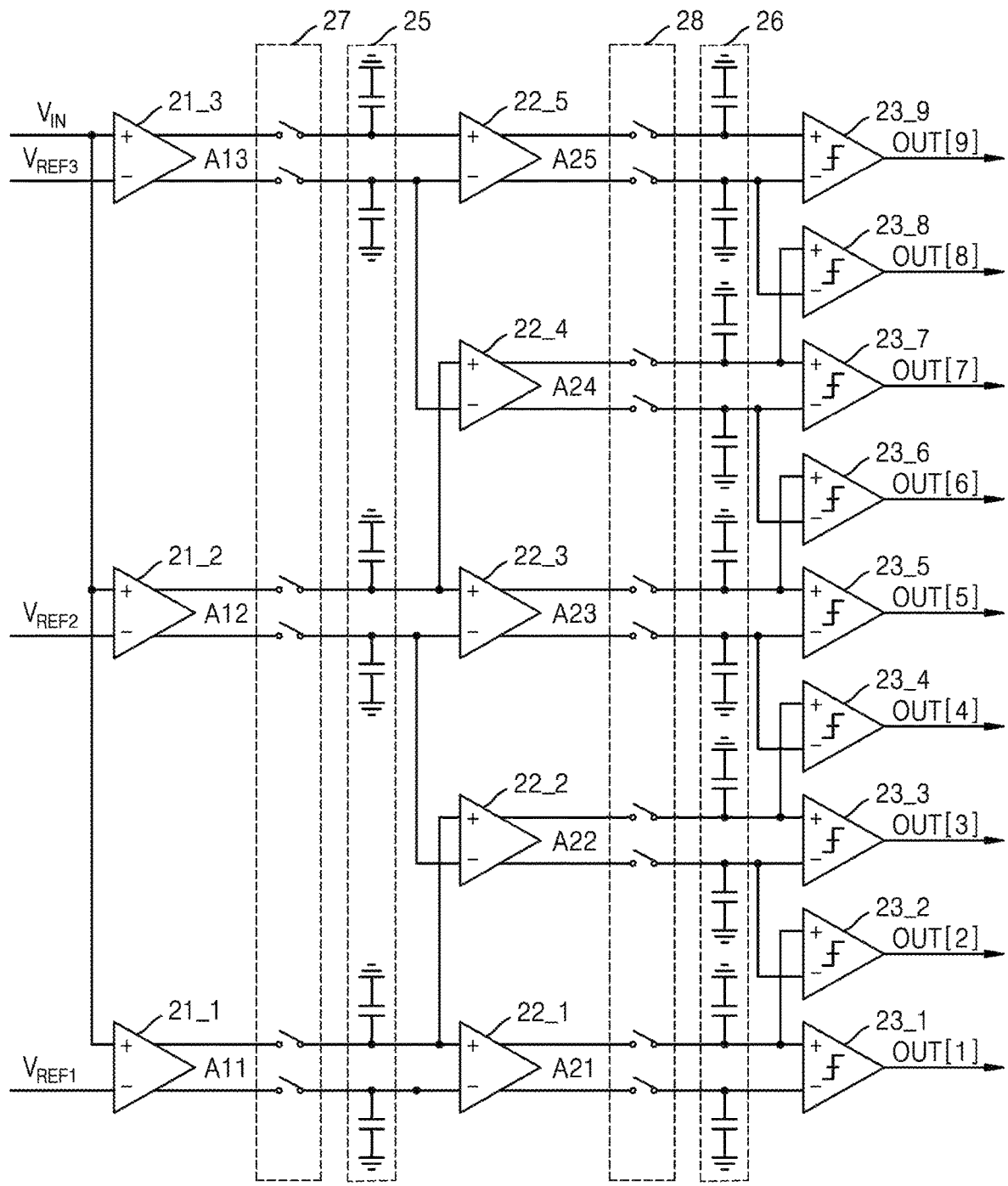
FIG. 2 is a circuit diagram of an ADC according to some example embodiments.

FIG. 2 is a circuit diagram of an ADC 20 according to some example embodiments. In detail, the circuit diagram of FIG. 2 illustrates the ADC 20 that generates nine bits of the digital output signal OUT. In FIG. 2, an input voltage $V_{IN}$ may correspond to the analog input signal IN in FIG. 1, and first to third reference voltages $V_{REF1}$ to $V_{REF3}$ may have respectively sequentially increasing magnitudes, such that $V_{REF1} < V_{REF2} < V_{REF3}$. The first to third reference voltages $V_{REF1}$ to $V_{REF3}$ may correspond to the reference voltages $V_{REFs}$ of FIG. 1. As shown in FIG. 2, the ADC 20 may include a plurality of first amplifiers 21_1 to 21_3, a plurality of second amplifiers 22_1 to 22_5, a plurality of comparators, e.g., first to ninth comparators 23_1 to 23_9, a plurality of first capacitors 25, a plurality of second capacitors 26, a plurality of first switches 27, and a plurality of second switches 28. FIG. 2 is described herein with reference to FIG. 1.

In some embodiments, the comparison circuit 13 in FIG. 1 may include as many comparators as the number of bits of the digital output signal OUT. For example, as shown in FIG. 2, the ADC 20 may include the first to ninth comparators 23_1 to 23_9, which respectively output first to ninth bits OUT[1] to OUT[9] of a 9-bit digital output signal OUT[1:9]. In some embodiments, as described above with reference to FIG. 1, when $2^N$ or $2^N+1$ bits of the digital output signal OUT are generated, the ADC 20 may further include a converter, which converts the digital output signal OUT into an N-bit binary digital signal, where N is an integer that is greater than 1. For example, the ADC 20 may further include a converter, which converts the 9-bit digital output signal OUT[1:9] into a 3-bit binary digital signal (N=3). In some embodiments, a signal corresponding to each of the bits of the digital output signal OUT may be a differential signal, and each of the first to ninth comparators 23_1 to 23_9 may output a differential signal. Descriptions below are mainly given for a structure that outputs the 9-bit digital output signal OUT[1:9], like the ADC 20 of FIG. 2. However, the present disclosure and the example embodiments thereof are not limited thereto.

In some embodiments, the second amplification circuit 12 in FIG. 1 may include fewer second amplifiers than the number of comparators of the comparison circuit 13 in FIG. 1. For example, as shown in FIG. 2, the ADC 20 may include five second amplifiers 22_1 to 22_5. The five second amplifiers 22_1 to 22_5 may be connected to the first to ninth comparators 23_1 to 23_9 through the second switches 28, as shown in FIG. 2. This connection structure may be referred to an interpolation structure or a time-interpolation structure. As shown in FIG. 2, the second capacitors 26 may be respectively connected to outputs of the five second amplifiers 22_1 to 22_5 and store charges corresponding to second output signals A21 to A25 of the five second amplifiers 22_1 to 22_5.

In some embodiments, the first amplification circuit 11 in FIG. 1 may include fewer first amplifiers than the number of second amplifiers of the second amplification circuit 12 in FIG. 1. For example, as shown in FIG. 2, the ADC 20 may include three first amplifiers 21_1 to 21_3. As described above, the three first amplifiers 21_1 to 21_3 may be connected to the five second amplifiers 22_1 to 22_5 through the first switches 27, as shown in FIG. 2, according to the interpolation structure. As shown in FIG. 2, the first capacitors 25 may be respectively connected to outputs of the three first amplifiers 21_1 to 21_3 and store charges corresponding to first output signals A11 to A13 of the three first amplifiers 21_1 to 21_3. Accordingly, the number of amplifiers, e.g., first amplifiers, receiving the input voltage $V_{IN}$ may be decreased. As a result, the input capacitance of the ADC 20 may be reduced.

The ADC 20 may perform conversion of the input voltage $V_{IN}$ in a normal mode and may be calibrated to have a high accuracy in a calibration mode. In some embodiments, as described below with reference to FIG. 5 and the like, only some amplifiers and comparators of the ADC 20 may be calibrated. For example, a branch (herein referred to as a main branch) including a first amplifier, a second amplifier, and a comparator, e.g., the first amplifier 21_3, the second amplifier 22_5, and the ninth comparator 23_9 in FIG. 2, which generate outputs corresponding to inputs of the first amplifier 21_3, may be calibrated. In other words, the ADC 20 may include three main branches and may be calibrated by calibrating the three main branches. Accordingly, calibration of the ADC 20 may be quickly and accurately performed. Each of a first amplifier, a second amplifier, and a comparator, which are to be calibrated, may receive a calibration signal, and an error therein may be compensated for according to the calibration signal. Examples of the first amplifier, the second amplifier, and the comparator, which receive a calibration signal, will be described with reference to FIGS. 7 to 9 below.

Figure 3:
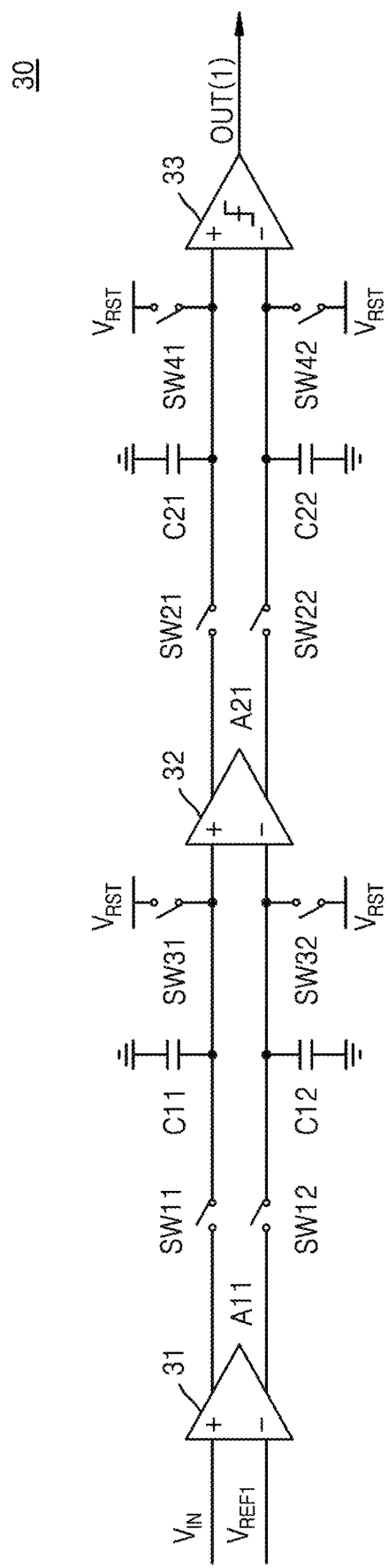
FIG. 3 is a circuit diagram of an ADC according to some example embodiments.

FIG. 3 is a circuit diagram of an ADC 30 according to some example embodiments. In greater detail, the circuit diagram of FIG. 3 illustrates a main branch included in the ADC 30. Referring to FIG. 3, the ADC 30 may include a first amplifier 31, a second amplifier 32, a first comparator 33, first switches SW11 and SW12, second switches SW21 and SW22, third switches SW31 and SW32, fourth switches SW41 and SW42, first capacitors C11 and C12, and second capacitors C21 and C22.

The first amplifier 31 may receive the input voltage $V_{IN}$ and the first reference voltage $V_{REF1}$ and generate the first output signal A11 by amplifying a difference between the input voltage $V_{IN}$ and the first reference voltage $V_{REF1}$. As shown in FIG. 3, the first output signal A11 may be a differential signal, and the first amplifier 31 may be a differential amplifier. In some embodiments, as described with reference to FIG. 7 below, the input voltage $V_{IN}$ and the first reference voltage $V_{REF1}$ may also be differential signals.

The first switches SW11 and SW12 in an on-state may connect the first amplifier 31 to the first capacitors C11 and C12, and the first capacitors C11 and C12 may store charges corresponding to the first output signal A11. As shown in FIG. 3, the third switches SW31 and SW32 in an on-state may apply the reset voltage $V_{RST}$ to the first capacitors C11 and C12. As described with reference to FIG. 4, the third switches SW31 and SW32 may be turned on earlier than the first switches SW11 and SW12, and the first switches SW11 and SW12 may be turned on after the third switches SW31 and SW32 are turned off. Accordingly, the first capacitors C11 and C12 may be precharged with the reset voltage $V_{RST}$ before storing the charges corresponding to the first output signal A11. In some embodiments, the reset voltage $V_{RST}$ may be a positive supply voltage that provides power to the first amplifier 31, the second amplifier 32, and the comparator 33.

The second amplifier 32 may receive voltages of the first capacitors C11 and C12 and generate the second output signal A21 by amplifying a difference between the voltages of the first capacitors C11 and C12. As shown in FIG. 3, the second output signal A21 may be a differential signal, and the second amplifier 32 may be a differential amplifier.

The second switches SW21 and SW22 in an on-state may connect the second amplifier 32 to the second capacitors C21 and C22, and the second capacitors C21 and C22 may store charges corresponding to the second output signal A21. As shown in FIG. 3, the fourth switches SW41 and SW42 in an on-state may apply the reset voltage $V_{RST}$ to the second capacitors C21 and C22. As described with reference to FIG. 4, the fourth switches SW41 and SW42 may be turned on earlier than the second switches SW21 and SW22, and the second switches SW21 and SW22 may be turned on after the fourth switches SW41 and SW42 are turned off. Accordingly, the second capacitors C21 and C22 may be precharged with the reset voltage $V_{RST}$ before storing the charges corresponding to the second output signal A21.

The comparator 33 may receive voltages of the second capacitors C21 and C22 and output the first bit OUT[1] of a digital output signal by amplifying a difference between the voltages of the second capacitors C21 and C22.

Figure 4:
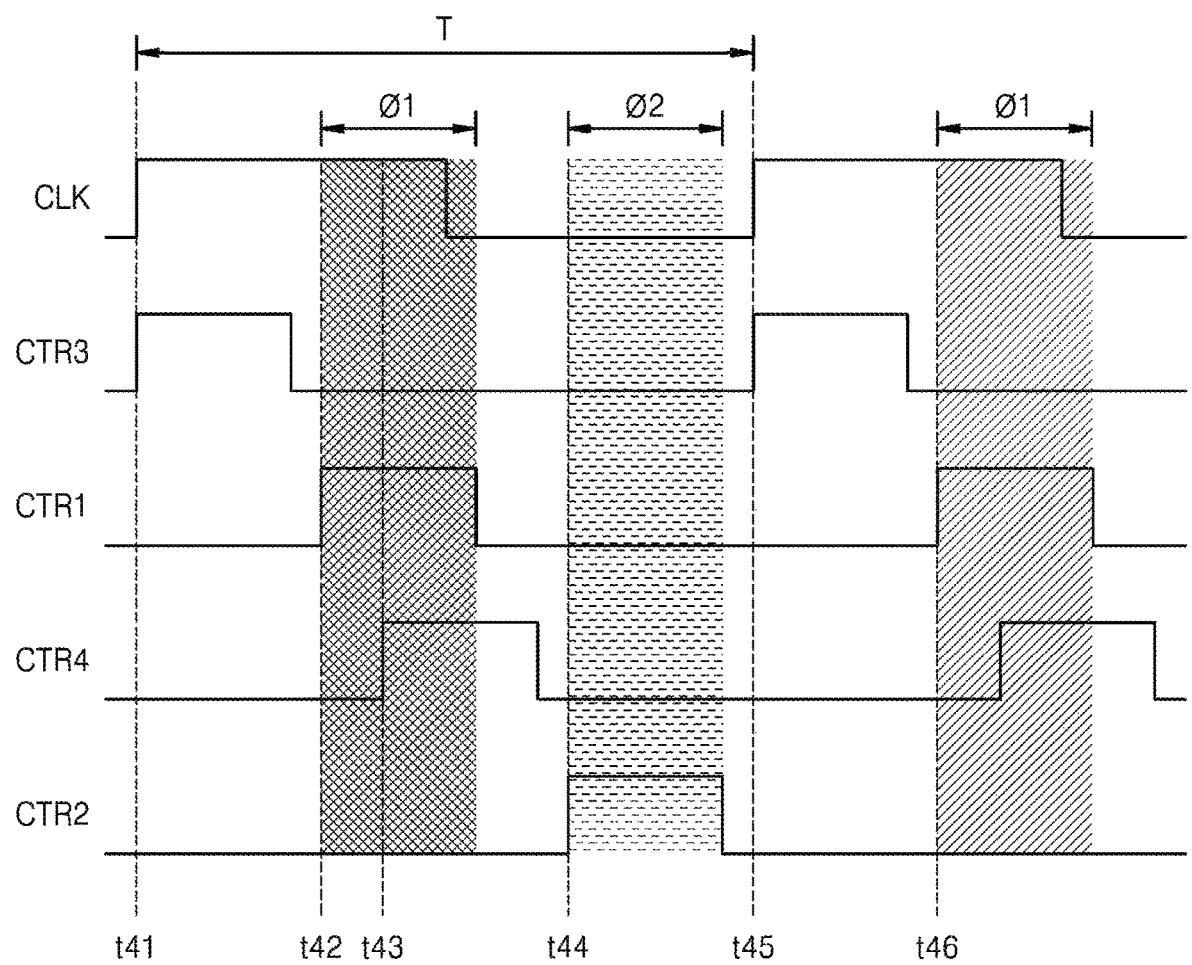
FIG. 4 is a timing diagram illustrating the operation of an ADC, according to some example embodiments.

FIG. 4 is a timing diagram illustrating the operation of an ADC, according to some example embodiments. In detail, the timing diagram of FIG. 4 illustrates first to fourth control signals CTR1 to CTR4, which are generated by the signal generation circuit 14 in FIG. 1, and the clock signal CLK. In some embodiments, the ADC 30 of FIG. 3 may operate as shown in FIG. 4. FIG. 4 is described with reference to FIGS. 1 and 3, and it is assumed that the ADC 30 of FIG. 3 includes the signal generation circuit 14 in FIG. 1.

Referring to FIG. 4, the clock signal CLK may oscillate with a period T. In some embodiments, the clock signal CLK may have a duty cycle of about 50%. The ADC 30 may have a sampling frequency corresponding to a frequency (i.e., 1/T) of the clock signal CLK and thus generate the digital output signal OUT every period T. The first control signal CTR1 may be provided to the first switches SW11 and SW12, the second control signal CTR2 may be provided to the second switches SW21 and SW22, the third control signal CTR3 may be provided to the third switches SW31 and SW32, and the fourth control signal CTR4 may be provided to the fourth switches SW41 and SW42. As described above with reference to FIG. 1, each switch may be turned on in response to a control signal at a high level and turned off in response to the control signal at a low level.

At a time t41, a rising edge of the clock signal CLK may occur. For example, the signal generation circuit 14 may activate the third control signal CTR3 in response to a rising edge of the clock signal CLK. The third switches SW31 and SW32 may be turned on in response to the third control signal CTR3 being activated, and accordingly, the first capacitors C11 and C12 may be precharged with the reset voltage $V_{RST}$. In some embodiments, and in contrast from that shown in FIG. 4, the third control signal CTR3 may be activated at a different time point than a rising edge of the clock signal CLK or synchronized with a falling edge of the clock signal CLK.

At a time t42, the first control signal CTR1 may be activated. For example, the signal generation circuit 14 may activate the first control signal CTR1 after deactivating the third control signal CTR3. The third switches SW31 and SW32 may be turned off in response to the third control signal CTR3 being deactivated, and the first switches SW11 and SW12 may be turned on in response to the first control signal CTR1 being activated. Accordingly, the first capacitors C11 and C12 may store charges corresponding to the first output signal A11, which is generated by the first amplifier 31 amplifying the difference between the input voltage $V_{IN}$ and the first reference voltage $V_{REF1}$. As shown in FIG. 4, the first control signal CTR1 may be activated in a first phase Φ1 of the clock signal CLK, and the difference between the input voltage $V_{IN}$ and the first reference voltage $V_{REF1}$ may be amplified in the first phase Φ1 of the clock signal CLK.

At a time t42, the first control signal CTR1 may be activated. For example, the signal generation circuit 14 may activate the fourth control signal CTR4 after activating the first control signal CTR1. As shown in FIG. 4, there may be an interval in which both the first and fourth control signals CTR1 and CTR4 are activated. In other words, due to a pipeline, an interval in which the first control signal CTR1 is activated may overlap with an interval in which the fourth control signal CTR4 is activated. Accordingly, an interval from when the third control signal CTR3 is activated to when the second control signal CTR2 is deactivated may be reduced, and accordingly, the period T of the clock signal CLK may be reduced. The second capacitors C21 and C22 may be precharged with the reset voltage $V_{RST}$ in response to the fourth control signal CTR4 being activated.

At a time t44, the second control signal CTR2 may be activated. For example, the signal generation circuit 14 may activate the second control signal CTR2 after deactivating the fourth control signal CTR4. The fourth switches SW41 and SW42 may be turned off in response to the fourth control signal CTR4 being deactivated, and the second switches SW21 and SW22 may be turned on in response to the second control signal CTR2 being activated. Accordingly, the second capacitors C21 and C22 may store charges corresponding to the second output signal A21, which is generated when the second amplifier 32 amplifies the difference between the voltages of the first capacitors C11 and C12. As shown in FIG. 4, the second control signal CTR2 may be activated in a second phase Φ2 of the clock signal CLK, and the difference between the voltages of the first capacitors C11 and C12 may be amplified in the second phase Φ2 of the clock signal CLK.

At a time t45, a rising edge of the clock signal CLK may occur, and the third control signal CTR3 may be activated. The second phase Φ2 may end before the third control signal CTR3 is activated. When the second phase Φ2 ends, the second control signal CTR2 may be deactivated. Due to the fourth and second control signals CTR4 and CTR2 being deactivated, the second capacitors C21 and C22 may store charges, and the comparator 33 may compare the voltages of the second capacitors C21 and C22 with each other.

At a time t46, the first control signal CTR1 may be activated. As described above, due to the third control signal CTR3 being deactivated and the first control signal CTR1 being activated, the first amplifier 31 may perform amplification. In some embodiments, as described with reference to FIG. 9, the comparator 33 may receive the first control signal CTR1 and operate in synchronization with the first control signal CTR1. In this case, the comparator 33 may compare the voltages of the second capacitors C21 and C22 with each other in response to the first control signal CTR1 being activated. Accordingly, the amplification operation of the first amplifier 31 and the comparison operation of the comparator 33 may be performed in parallel, and the operations of the ADC 30 may be pipelined.

Figure 5:
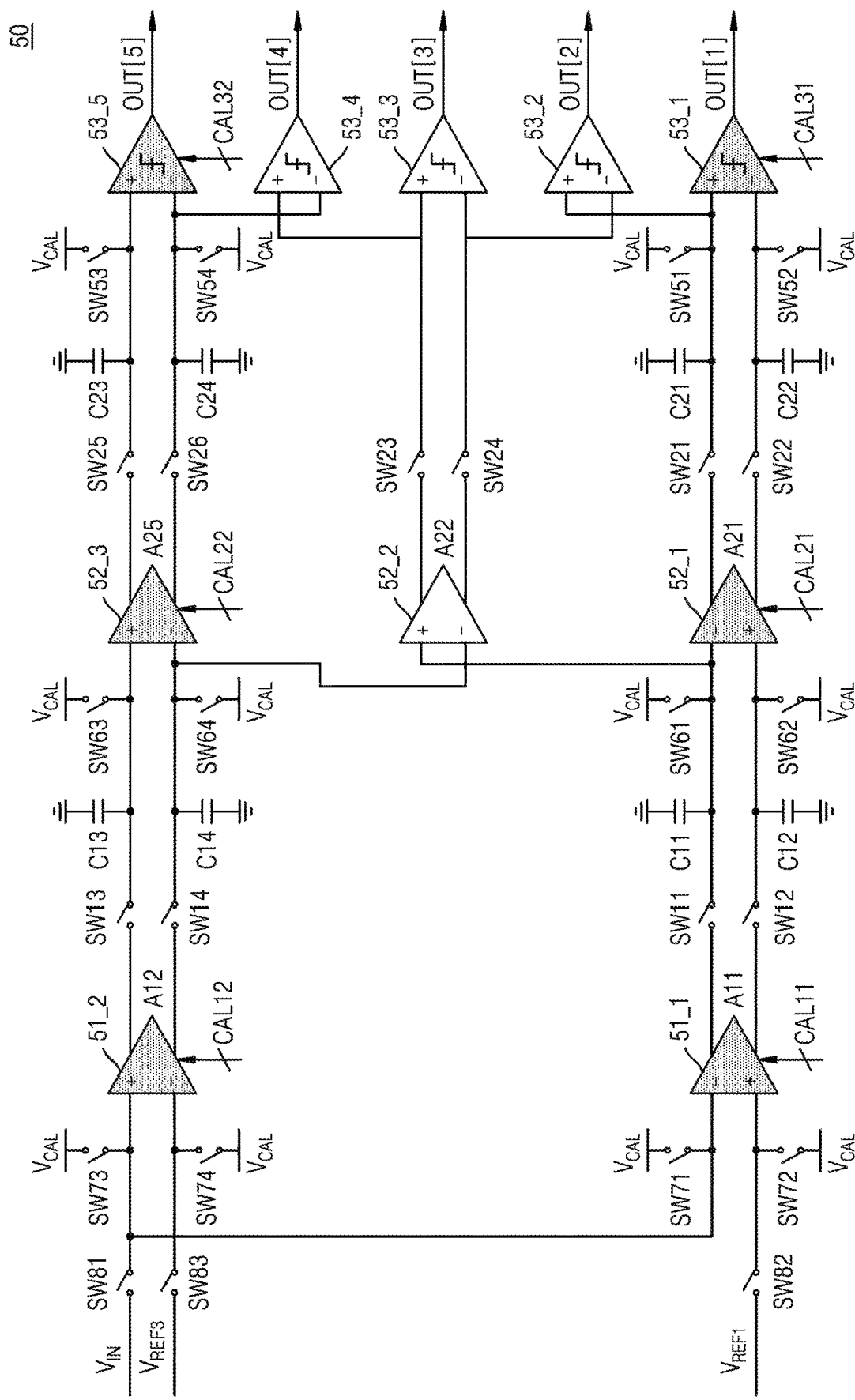
FIG. 5 is a circuit diagram of an ADC according to some example embodiments.

FIG. 5 is a circuit diagram of an ADC 50 according to some example embodiments. In greater detail, the circuit diagram of FIG. 5 illustrates two main branches included in the ADC 50 and branches (herein referred to as interpolated branches) between the two main branches. Referring to FIG. 5, the ADC 50 may include first amplifiers 51_1 and 51_2, second amplifiers 52_1 to 52_3, first to fifth comparators 53_1 to 53_5, first switches SW11 to SW14, second switches SW21 to SW26, fifth switches SW51 to SW54, sixth switches SW61 to SW64, seventh switches SW71 to SW74, and eighth switches SW81 to SW83. In some embodiments, as described above with reference to FIG. 3, the ADC 50 may further include third switches, which precharge first capacitors C11 to C14 with the reset voltage $V_{RST}$, and fourth switches, which precharge second capacitors C21 to C24 with the reset voltage $V_{RST}$. Redundant descriptions given with reference to FIG. 3 are omitted herein in the interest of brevity.

The ADC 50 may be set to a calibration mode, in which input offsets of amplifiers and comparators included in the ADC 50 may be compensated for. For example, an amplifier or a comparator may have an input offset that may be adjusted according to a calibration signal. In the calibration mode, the same voltage may be applied to both input terminals of an amplifier or a comparator. Transition of an output of the amplifier or the comparator may be detected by adjusting a calibration signal of the amplifier or the comparator, and the calibration may be set to a value corresponding to the detected transition.

In some embodiments, among the amplifiers and comparators of the ADC 50, amplifiers and comparators included in a main branch may be calibrated in the calibration mode. For example, as shown in the shaded portions in FIG. 5, input offsets of the first amplifiers 51_1 and 51_2, the second amplifiers 52_1 and 52_3, and the first and fifth comparators 53_1 and 53_5, which are included in main branches, may be compensated for. For this compensation, each of the first amplifiers 51_1 and 51_2, the second amplifiers 52_1 and 52_3, and the first and fifth comparators 53_1 and 53_5 may receive one of calibration signals CAL11, CAL12, CAL21, CAL22, CAL31, and CAL32, as shown in FIG. 5. Accordingly, a time taken to calibrate the ADC 50 may be reduced. As described with reference to FIG. 6 below, the second amplifiers 52_1 and 52_3 may be calibrated after the first and fifth comparators 53_1 and 53_5 are calibrated, and the first amplifiers 51_1 and 51_2 may be calibrated after the second amplifiers 52_1 and 52_3 are calibrated.

Referring to FIG. 5, the fifth switches SW51 to SW54 may be turned on in the calibration mode and may apply, in an on-state, a calibration voltage $V_{CAL}$ to both input terminals of the first comparator 53_1 and both input terminals of the fifth comparator 53_5. The calibration voltage $V_{CAL}$ may include a direct current (DC) voltage. In some embodiments, the calibration voltage $V_{CAL}$ may correspond to a common mode voltage of an amplifier and a comparator. In some embodiments, and in contrast from what is shown in FIG. 5, the fifth switch SW52 in the on-state may connect the both input terminals of the first comparator 53_1 to each other.

The sixth switches SW61 to SW64 may be turned on in the calibration mode and may apply, in an on-state, the calibration voltage $V_{CAL}$ to the input terminals of the second amplifiers 52_1 and 52_3. In some embodiments, and in contrast from what is shown in FIG. 5, the sixth switch SW62 in the on-state may connect the both input terminals of the second amplifier 52_1 to each other. The seventh switches SW71 to SW74 may be turned on in the calibration mode and may apply, in an on-state, the calibration voltage $V_{CAL}$ to the input terminals of the first amplifiers 51_1 and 51_2. In some embodiments, and in contrast from what is shown in FIG. 5, the seventh switch SW72 in the on-state may connect the both input terminals of the first amplifier 51_1 to each other.

The eighth switches SW81 to SW83 may be turned on in the normal mode and turned off in the calibration mode. The eighth switches SW81 to SW83 in an on-state may provide the input voltage $V_{IN}$ and the first and third reference voltages $V_{REF1}$ and $V_{REF3}$ to the first amplifiers 51_1 and 51_2, and the eighth switches SW81 to SW83 in an off-state may block the input voltage $V_{IN}$ and the first and third reference voltages $V_{REF1}$ and $V_{REF3}$. In some embodiments, the eighth switches SW81 to SW83 may be connected in a different manner than FIG. 5 so as to operate as described above.

Figure 6:
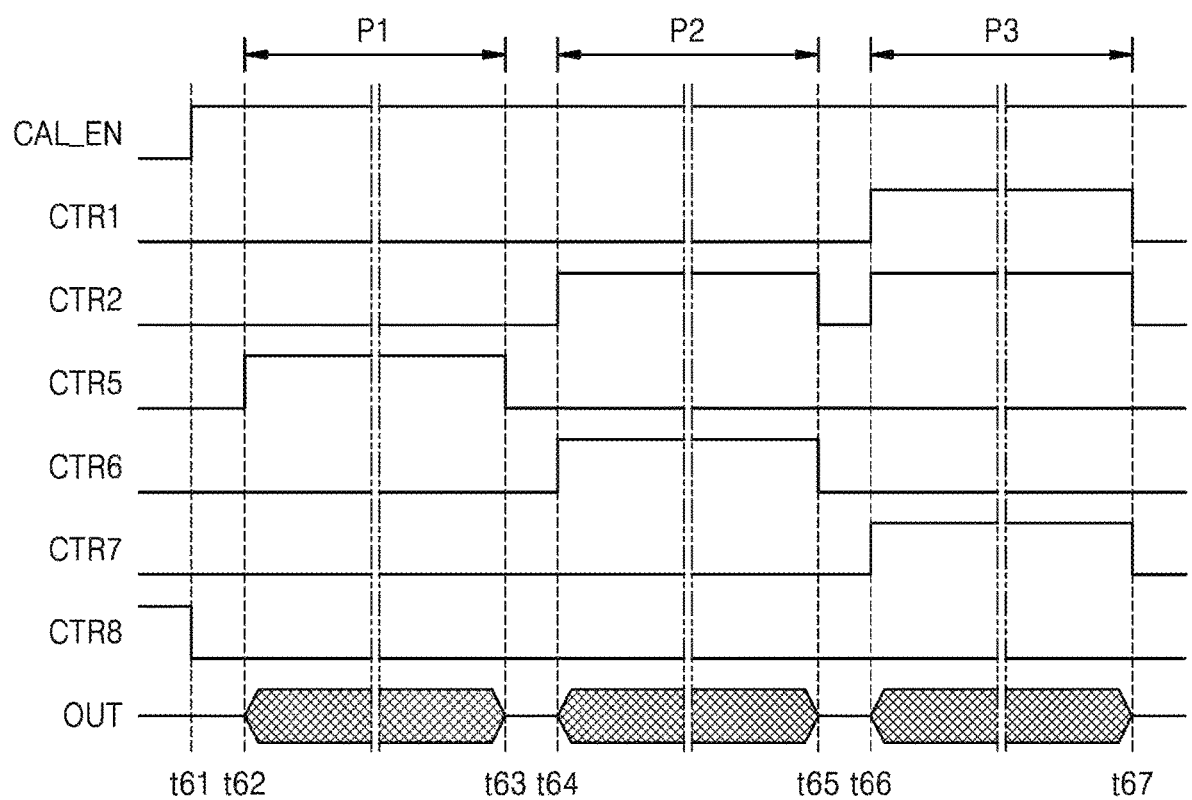
FIG. 6 is a timing diagram illustrating the operation of an ADC, according to some example embodiments.

FIG. 6 is a timing diagram illustrating the operation of an ADC, according to some example embodiments. In greater detail, the timing diagram of FIG. 6 illustrates an operation of calibrating the ADC 50 of FIG. 5 in the calibration mode. The first and second control signals CTR1 and CTR2 and fifth to eighth control signals CTR5 to CTR8 in FIG. 6 may be generated based on the clock signal CLK by the signal generation circuit 14 in FIG. 1. FIG. 6 is described with reference to FIGS. 1 and 5 below. It is assumed that the ADC 50 of FIG. 5 includes the signal generation circuit 14 in FIG. 1.

The first control signal CTR1 may be provided to the first switches SW11 to SW14 in FIG. 5, the second control signal CTR2 may be provided to the second switches SW21 to SW26 in FIG. 5, the fifth control signal CTR5 may be provided to the fifth switches SW51 to SW54 in FIG. 5, the sixth control signal CTR6 may be provided to the sixth switches SW61 to SW64 in FIG. 5, the seventh control signal CTR7 may be provided to the seventh switches SW71 to SW74 in FIG. 5, and the eighth control signal CTR8 may be provided to the eighth switches SW81 to SW83 in FIG. 5. In some embodiments, the third control signal CTR3, which is provided to third switches that precharge the first capacitors C11 to C14 with the reset voltage $V_{RST}$, may be deactivated in the calibration mode. In some embodiments, the fourth control signal CTR4, which is provided to fourth switches that precharge the second capacitors C21 to C24 with the reset voltage $V_{RST}$, may be deactivated in the calibration mode.

Referring to FIG. 6, at a time t61, the calibration mode may start. For example, as shown in FIG. 6, a calibration enable signal CAL_EN may be activated, and the signal generation circuit 14 may identify the calibration mode in response to the calibration enable signal CAL_EN being activated. The signal generation circuit 14 may deactivate the eighth control signal CTR8 in response to the calibration enable signal CAL_EN being activated. Accordingly, the eighth switches SW81 to SW83 may be in an off-state, and provision of the input voltage $V_{IN}$ and the first and third reference voltages $V_{REF1}$ and $V_{REF3}$ to the first amplifiers 51_1 and 51_2 may be interrupted.

From a time t62 to a time t63, the fifth control signal CTR5 may be activated, and the fifth switches SW51 to SW54 may be in an on-state. For example, the signal generation circuit 14 may activate the fifth control signal CTR5 to calibrate the first comparator 53_1 and the fifth comparator 53_5. The second switches SW21, SW22, SW25, and SW26 may be in an off-state because the second control signal CTR2 is deactivated, and accordingly, the calibration voltage $V_{CAL}$ may be provided to both input terminals of each of the first comparator 53_1 and the fifth comparator 53_5. In a first interval P1 from the time t62 to the time t63, the calibration signals CAL31 and CAL32 may be adjusted based on an output, i.e., the first bit OUT[1], of the first comparator 53_1 and an output, i.e., the fifth bit OUT[5], of the fifth comparator 53_5, and the first comparator 53_1 and the fifth comparator 53_5 may be calibrated.

From a time t64 to a time t65, the second control signal CTR2 and the sixth control signal CTR6 may be activated, and the second switches SW21 to SW26 and the sixth switches SW61 to SW64 may be in an on-state. For example, the signal generation circuit 14 may activate the second control signal CTR2 and the sixth control signal CTR6 to calibrate the second amplifiers 52_1 and 52_3. The first switches SW11 to SW14 may be in an off-state because the first control signal CTR1 is deactivated, and accordingly, the calibration voltage $V_{CAL}$ may be provided to both input terminals of each of the second amplifiers 52_1 and 52_3. The first comparator 53_1 and the fifth comparator 53_5 may respectively receive the second output signals A21 and A25 because the second control signal CTR2 is activated and the fifth control signal CTR5 is deactivated. In a second interval P2 from the time t64 to the time t65, the calibration signals CAL31 and CAL32, which are respectively provided to the first comparator 53_1 and the fifth comparator 53_5, may be respectively set to values derived in the first interval P1; the calibration signals CAL21 and CAL22 may be adjusted based on the output, i.e., the first bit OUT[1], of the first comparator 53_1 and the output, i.e., the fifth bit OUT[5], of the fifth comparator 53_5; and the second amplifiers 52_1 and 52_3 may be calibrated.

From a time t66 to a time t67, the first control signal CTR1, the second control signal CTR2, and the seventh control signal CTR7 may be activated, and the first switches SW11 to SW14, second switches SW21 to SW26, and seventh switches SW71 to SW74 may be in an on-state. For example, the signal generation circuit 14 may activate the first control signal CTR1, the second control signal CTR2, and the seventh control signal CTR7 to calibrate the first amplifiers 51_1 and 51_2. The eighth switches SW81 to SW83 may be in an off-state because the eighth control signal CTR8 is deactivated, and accordingly, the calibration voltage $V_{CAL}$ may be provided to both input terminals of each of the first amplifiers 51_1 and 51_2. The second amplifiers 52_1 and 52_3 may respectively receive the first output signals A11 and A12 because the first control signal CTR1 is activated and the sixth control signal CTR6 is deactivated. The first comparator 53_1 and the fifth comparator 53_5 may respectively receive the second output signals A21 and A25 because the second control signal CTR2 is activated and the fifth control signal CTR5 is deactivated. In a third interval P3 from the time t66 to the time t67, the calibration signals CAL31 and CAL32, which are respectively provided to the first comparator 53_1 and the fifth comparator 53_5, may be respectively set to values derived in the first interval P1; and calibration signals CAL21 and CAL22, which are respectively provided to the second amplifiers 52_1 and 52_3, may be respectively set to values derived in the second interval P2. Accordingly, in the third interval P3, the calibration signals CAL11 and CAL12 may be adjusted based on the output, i.e., the first bit OUT[1], of the first comparator 53_1 and the output, i.e., the fifth bit OUT[5], of the fifth comparator 53_5; and the first amplifiers 51_1 and 51_2 may be calibrated.

In some embodiments the ADC 50 may comprise a plurality of fifth switches SW51 to SW54 configured to apply a calibration voltage to inputs of $2^{N-2}+1$ comparators in a first interval of a calibration mode, where N is a integer greater than 1. The $2^{N-2}+1$ comparators may respectively correspond to $2^{N-2}+1$ first amplifiers among $2^{N}+1$ comparators. The ADC 50 may further comprise a plurality of sixth switches SW61 to SW4 configured to apply the calibration voltage to inputs of $2^{N-2}+1$ second amplifiers in a second interval of the calibration mode following the first interval of the calibration mode, the $2^{N-2}+1$ second amplifiers respectively corresponding to the $2^{N-2}+1$ first amplifiers among the $2^{N}+1$ first amplifiers. The ADC 50 may further comprise a plurality of seventh switches SW71 to SW74 configured to apply the calibration voltage to inputs of the $2^{N-2}+1$ first amplifiers in a third interval of the calibration mode following the second interval of the calibration mode.

Figure 7:
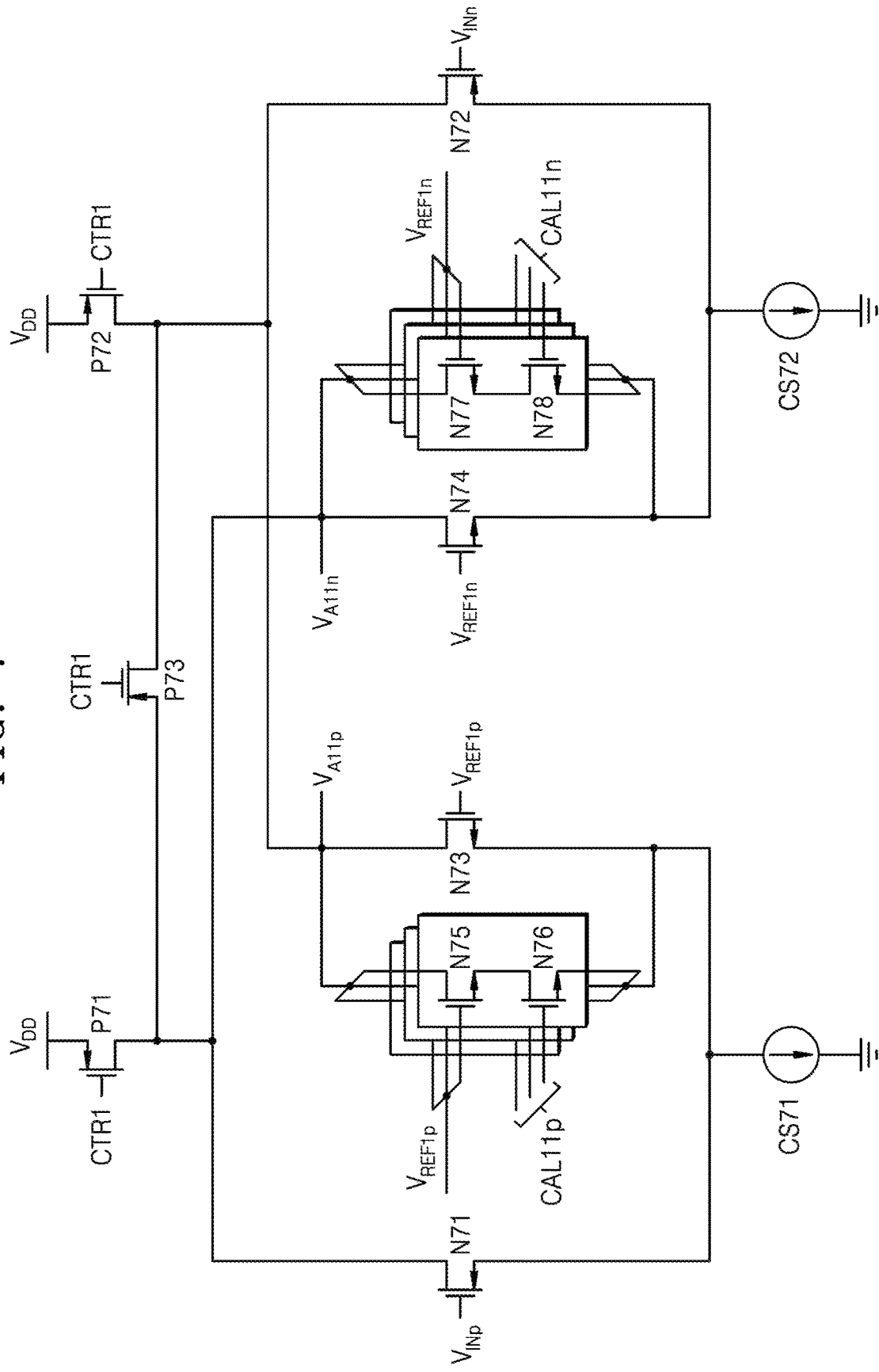
FIG. 7 is a circuit diagram of a first amplifier according to some example embodiments.

FIG. 7 is a circuit diagram of a first amplifier 70 according to some example embodiments. In the first amplifier 70 of FIG. 7, the input voltage $V_{IN}$, the first reference voltage $V_{REF1}$, the calibration signal CAL 11, and the first output signal A11 may all be differential voltages. The first amplifier 70 of FIG. 7 is just an example, and first amplifiers described above with reference to the drawings are not limited to the first amplifier 70 of FIG. 7. In the circuit diagrams herein, a transistor is illustrated as an n-channel field effect transistor (NFET) or a p-channel FET (PFET), but the present disclosure and example embodiments thereof are not limited thereto.

Referring to FIG. 7, the first amplifier 70 may include a first current source CS71 and a second current source CS72, each generating a constant current. The first amplifier 70 may include transistors N71 and N72 configured to receive an input voltage (e.g., $V_{INp}$ and $V_{INn}$) and transistors N73 and N74 configured to receive a first reference voltage (e.g., $V_{REF1p}$ and $V_{REF1n}$). The first amplifier 70 may include a plurality of transistors, which include a transistor N75 and receive a positive first reference voltage $V_{REF1p}$ in common, and a plurality of transistors, which include a transistor N76 and respectively receive bits of a positive calibration signal CAL11$p$. The first amplifier 70 may include a plurality of transistors, which include a transistor N77 and receive a negative first reference voltage $V_{REF1n}$ in common, and a plurality of transistors, which include a transistor N78 and respectively receive bits of a negative calibration signal CAL11$n$. As shown in FIG. 7, the transistors N75 and N76 may be connected in series to each other, and the transistors N77 and N78 may be connected in series to each other. As shown in FIG. 7, transistors receiving a calibration signal may be connected in series to transistors receiving a reference voltage instead of transistors receiving an input voltage, and accordingly, an influence of the value of the calibration signal on an input voltage, e.g., an analog input, of an ADC including the first amplifier 70 may be eliminated.

As shown in FIG. 7, the first amplifier 70 may include transistors P71, P72, and P73 configured to receive the first control signal CTR1. Accordingly, when the first control signal CTR1 is deactivated, that is, when the first control signal CTR1 is at a low level, outputs of the first amplifier 70 may be precharged to a positive supply voltage $V_{DD}$, and positive and negative voltages $V_{A11p}$ and $V_{A11n}$ corresponding to the first output signal A11 may correspond to the positive supply voltage $V_{DD}$. When the first control signal CTR1 is activated, the first amplifier 70 may output a voltage (e.g., $V_{A11p}$ and $V_{A11n}$) corresponding to the first output signal A11 by amplifying a difference between the input voltage (e.g., $V_{IN\_p}$ and $V_{INn}$) and the first reference voltage (e.g., $V_{REF1p}$ and $V_{REF1n}$).

Figure 8:
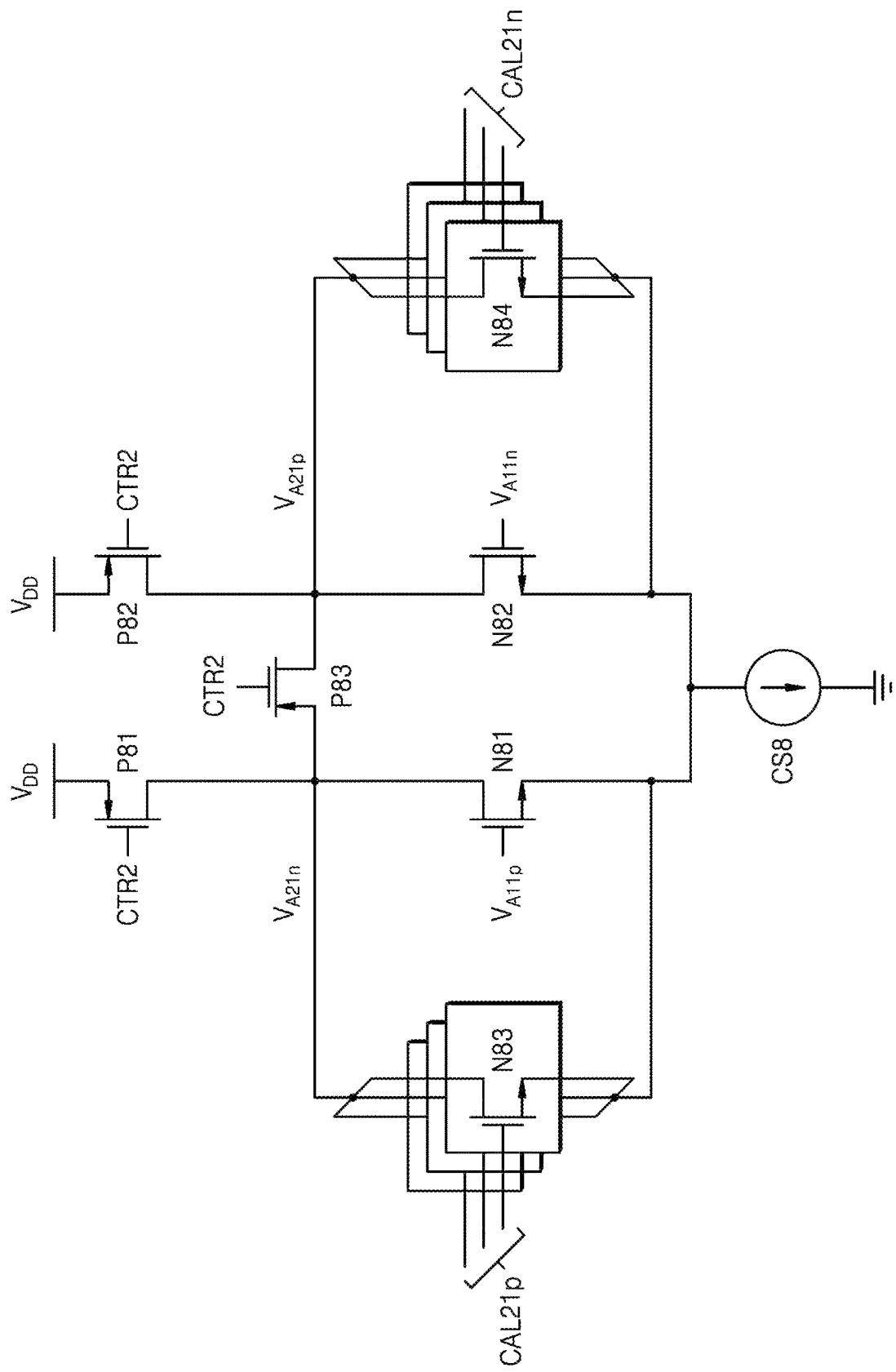
FIG. 8 is a circuit diagram of a second amplifier according to some example embodiments.

FIG. 8 is a circuit diagram of a second amplifier 80 according to some example embodiments. In the second amplifier 80 of FIG. 8, the first output signal A11, the calibration signal CAL21, and the second output signal A21 may all be differential voltages. The second amplifier 80 of FIG. 8 is just an example, and second amplifiers discussed herein are not limited to the second amplifier 80 of FIG. 8.

Referring to FIG. 8, the first amplifier 80 may include a current source CS8 generating a constant current. The second amplifier 80 may include transistors N81 and N82 configured to receive the voltage (e.g., $V_{A11p}$ and $V_{A11n}$) corresponding to the first output signal A11. The second amplifier 80 may include a plurality of transistors, which include a transistor N83 and respectively receive bits of a positive calibration signal CAL21$p$, and a plurality of transistors, which include a transistor N84 and respectively receive bits of a negative calibration signal CAL21$n$.

As shown in FIG. 8, the second amplifier 80 may include transistors P81, P82, and P83, which receive the second control signal CTR2. Accordingly, when the second control signal CTR2 is deactivated, that is, when the second control signal CTR2 is at a low level, outputs of the second amplifier 80 may be precharged to the positive supply voltage $V_{DD}$, and positive and negative voltages $V_{A21p}$ and $V_{A21n}$ corresponding to the second output signal A21 may correspond to the positive supply voltage $V_{DD}$. When the second control signal CTR2 is activated, the second amplifier 80 may output a voltage (e.g., $V_{A21p}$ and $V_{A2n}$) corresponding to the second output signal A21 by amplifying the voltage (e.g., $V_{A11p}$ and $V_{A11n}$) corresponding to the second output signal A11.

Figure 9:
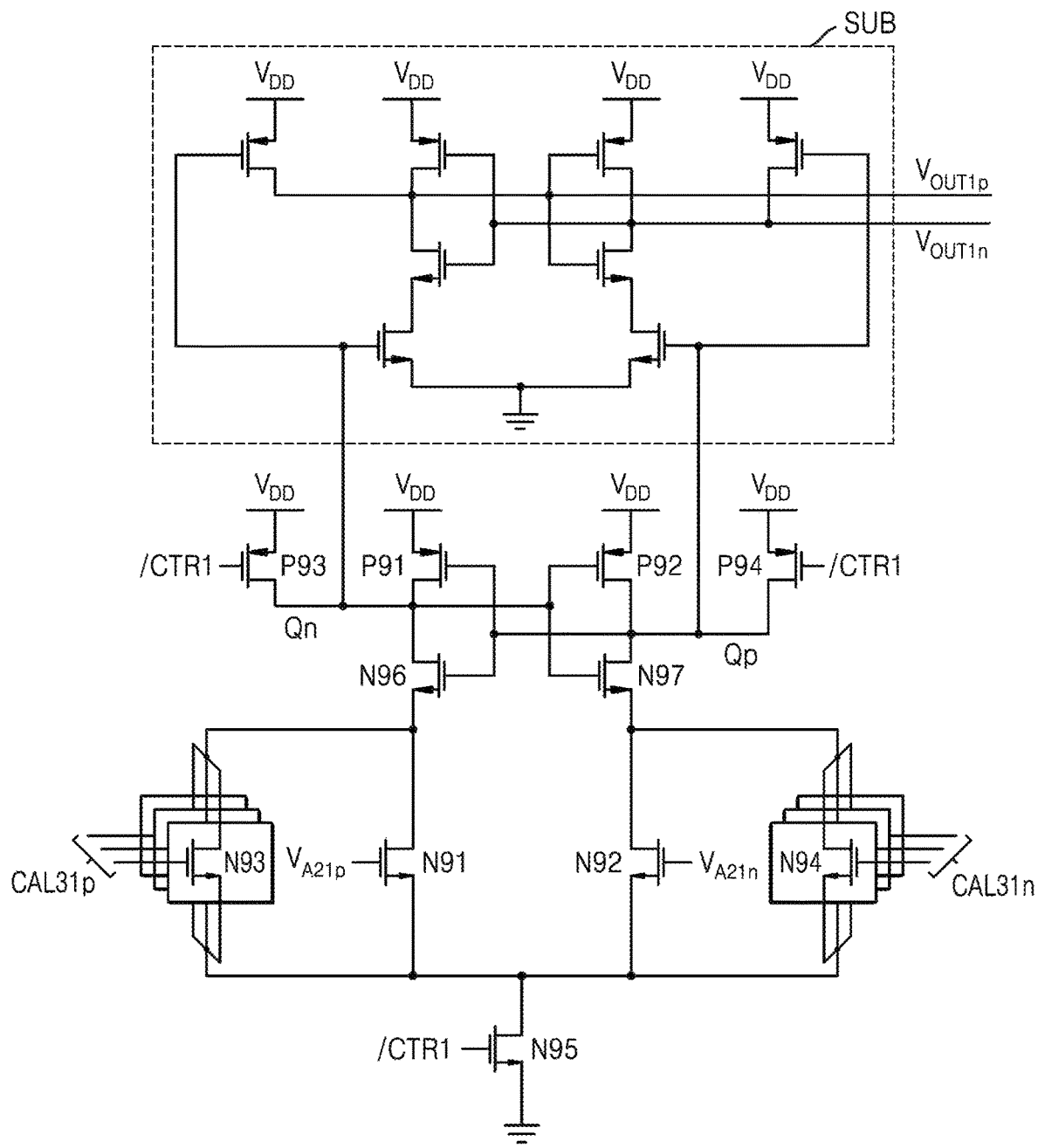
FIG. 9 is a circuit diagram of a comparator according to some example embodiments.

FIG. 9 is a circuit diagram of a comparator 90 according to some example embodiments. In the comparator 90 of FIG. 9, the second output signal A21, the calibration signal CAL31, and an output signal, e.g., the first bit OUT[1], may all be differential voltages. The comparator 90 of FIG. 9 is just an example, and comparators discussed herein are not limited to the comparator 90 of FIG. 9.

Referring to FIG. 9, the comparator 90 may include transistors N91 and N92 configured to receive the voltage (e.g., $V_{A21p}$ and $V_{A21n}$) corresponding to the second output signal A21. The comparator 90 may include a plurality of transistors, which include a transistor N93 and respectively receive bits of a positive calibration signal CAL31$p$, and a plurality of transistors, which include a transistor N94 and respectively receive bits of a negative calibration signal CAL31$n$. The comparator 90 may include transistors N96, N97, P91, and P92, which correspond to cross-coupled inverters and generate internal signals Qp and Qn. The internal signals Qp and Qn may be amplified by a sub circuit SUB. The sub circuit SUB may output a voltage (e.g., $V_{OUT1p}$ and $V_{OUT1n}$) corresponding to the output signal, e.g., the first bit OUT[1].

As shown in FIG. 9, the comparator 90 may include transistors N95, P93, and P94 receiving an inverted first control signal/CTR1. When the first control signal CTR1 is deactivated, that is, when the first control signal CTR1 is at a low level, the transistor N95 may be turned on and the transistors P93 and P94 may be turned off. Accordingly, the voltage (e.g., $V_{A21p}$ and $V_{A21n}$) corresponding to the second output signal A21 may be amplified, and the internal signals Qp and Qn may be generated and provided to the sub circuit SUB. When the first control signal CTR1 is activated, that is, when the first control signal CTR1 is at a high level, the transistor N95 may be turned off and the transistors P93 and P94 may be turned on. Accordingly, the internal signals Qp and Qn may each correspond to the positive supply voltage $V_{DD}$, and the sub circuit SUB may function as a latch. Accordingly, the voltage (e.g., $V_{OUT1p}$ and $V_{OUT1n}$) corresponding to the output signal, e.g., the first bit OUT[1], may be maintained.

Figure 10:
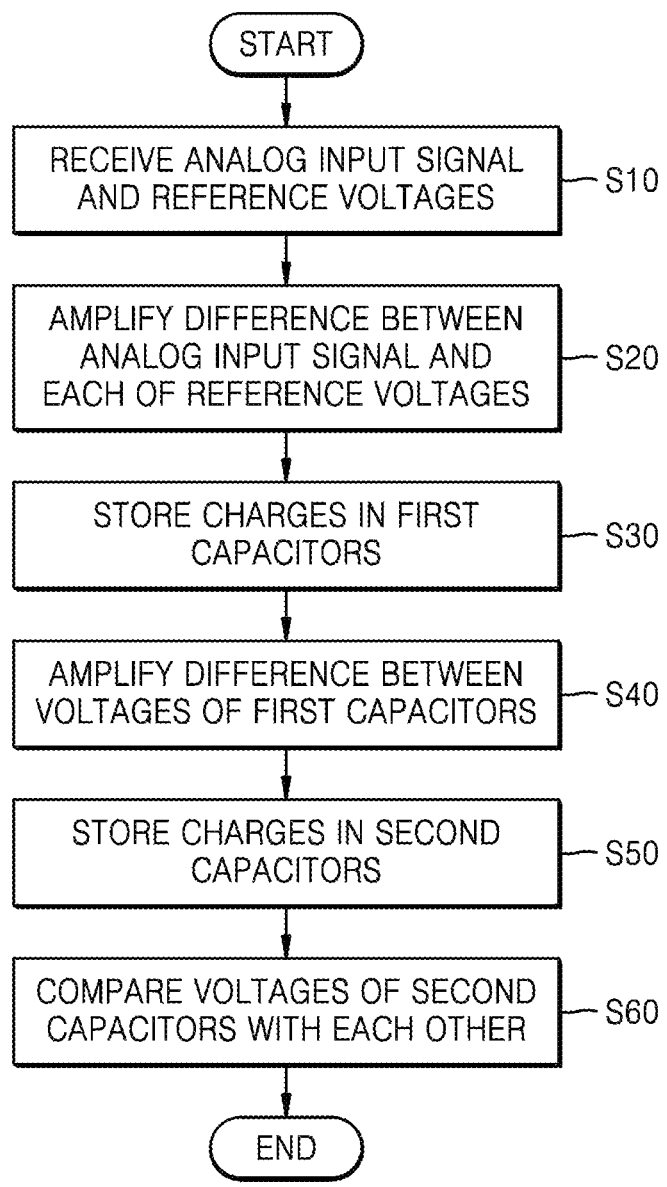
FIG. 10 is a flowchart of a method for analog-to-digital conversion, according to some example embodiments.

FIG. 10 is a flowchart of a method for analog-to-digital conversion, according to some example embodiments. Referring to FIG. 10, the method for analog-to-digital conversion may include a plurality of operations S10 to S60. In some embodiments, the method of FIG. 10 may be performed by the ADC 10 of FIG. 1. FIG. 10 is thus described with reference to FIG. 1.

Referring to FIG. 10, the analog input signal IN and the reference voltages $V_{REFs}$ may be received in operation S10. For example, the first amplification circuit 11 may receive the analog input signal IN and the reference voltages $V_{REFs}$. Accordingly, as described above with reference to FIG. 1, capacitors for track-and-hold may be omitted, and the input capacitance of the ADC 10 may be decreased.

A difference between the analog input signal IN and each of the reference voltages $V_{REFs}$ may be amplified in operation S20. For example, the first amplification circuit 11 may generate the first output signals A11 to A1$k$ by amplifying differences between the analog input signal IN and the reference voltages $V_{REFs}$.

Charges may be stored in the first capacitors 15 in operation S30. For example, charges corresponding to the first output signals A11 to A1$k$ generated in operation S20 may be stored in the first capacitors 15. In some embodiments, as described above with reference to FIGS. 3 and 4, the method of FIG. 10 may further include an operation of precharging outputs of the first amplification circuit 11 and/or the first capacitors 15 before operations S20 and S30.

A difference between voltages of the first capacitors 15 may be amplified in operation S40. For example, the second amplification circuit 12 may be connected to the first capacitors 15 and generate the second output signals A21 to A2*m* by amplifying differences between the voltages of the first capacitors 15.

Charges may be stored in the second capacitors 16 in operation S50. For example, charges corresponding to the second output signals A21 to A2*m* generated in operation S40 may be stored in the second capacitors 16. In some embodiments, as described above with reference to FIGS. 3 and 4, the method of FIG. 10 may further include an operation of precharging outputs of the second amplification circuit 12 and/or the second capacitors 16 before operations S40 and S50.

Voltages of the second capacitors 16 may be compared with each other in operation S60. For example, the comparison circuit 13 may be connected to the second capacitors 16 and generate the digital output signal OUT by comparing the voltages of the second capacitors 16 with each other. As described above with reference to FIG. 1, the digital output signal OUT may correspond to a thermometer code.

Figure 11:
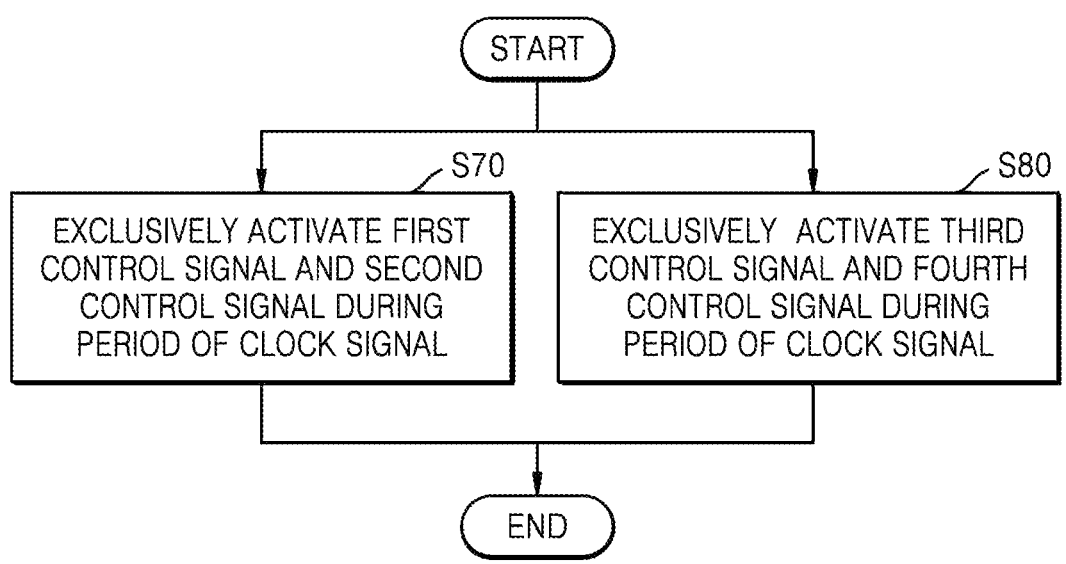
FIG. 11 is a flowchart of a method for analog-to-digital conversion, according to some example embodiments.

FIG. 11 is a flowchart of a method for analog-to-digital conversion, according to some example embodiments. In greater detail, FIG. 11 is a flowchart of a method of generating control signals controlling switches to perform the method of FIG. 10. As shown in FIG. 11, the method of generating control signals may include operations S70 and S80. In some embodiments, the method of FIG. 11 may be performed by the signal generation circuit 14 in FIG. 1. FIG. 11 is described with reference to FIGS. 1, 3, and 4.

Referring to FIG. 11, the first control signal CTR1 and the second control signal CTR2 may be mutually exclusively activated during a period of the clock signal CLK in operation S70. For example, the signal generation circuit 14 may generate the first control signal CTR1 and the second control signal CTR2, based on an edge of the clock signal CLK, such that the first control signal CTR1 and the second control signal CTR2 are not activated simultaneously. As described above with reference to FIG. 1, the first control signal CTR1 may be provided to the first switches 17 connected to outputs of the first amplification circuit 11, and the first switches 17 may provide the first output signals A11 to A1*k* of the first amplification circuit 11 to the first capacitors 15 in response to the first control signal CTR1 that is activated. The second control signal CTR2 may be provided to the second switches 18 connected to outputs of the second amplification circuit 12, and the second switches 18 may provide the second output signals A21 to A2*m* of the second amplification circuit 12 to the second capacitors 16 in response to the second control signal CTR2 that is activated. Because the first control signal CTR1 and the second control signal CTR2 are exclusively activated at different portions of the period of the clock signal CLK, an amplification operation of the first amplification circuit 11 may not overlap with an amplification operation of the second amplification circuit 12 on the time axis.

The third control signal CTR3 and the fourth control signal CTR4 may be exclusively activated during a period of the clock signal CLK in operation S80. For example, the signal generation circuit 14 may generate the third control signal CTR3 and the fourth control signal CTR4, based on an edge of the clock signal CLK, such that the third control signal CTR3 and the fourth control signal CTR4 are not activated simultaneously. As described above with reference to FIG. 3, the third control signal CTR3 may be provided to the third switches SW31 and SW32, and the third switches SW31 and SW32 may precharge the first capacitors C11 and C12 with the reset voltage $V_{RST}$ in response to the third control signal CTR3 that is activated. The fourth control signal CTR4 may be provided to the fourth switches SW41 and SW42, and the fourth switches SW41 and SW42 may precharge the second capacitors C21 and C22 with the reset voltage $V_{RST}$ in response to the fourth control signal CTR4 that is activated. Because the third control signal CTR3 and the fourth control signal CTR4 are exclusively activated at different portions of the period of the clock signal CLK, precharging of the first capacitors C11 and C12 may not overlap with precharging of the second capacitors C21 and C22 on the time axis.

In some embodiments, the signal generation circuit 14 may exclusively activate the first control signal CTR1 and the third control signal CTR3. For example, as described above with reference to FIG. 4, the first control signal CTR1 may be activated after the third control signal CTR3 is deactivated. In some embodiments, the signal generation circuit 14 may exclusively activate the second control signal CTR2 and the fourth control signal CTR4. For example, as described above with reference to FIG. 4, the second control signal CTR2 may be activated after the fourth control signal CTR4 is deactivated. In some embodiments, the signal generation circuit 14 may generate the first control signal CTR1 and the fourth control signal CTR4 such that an interval during the first control signal CTR1 is activated overlaps with an interval during the fourth control signal CTR4 is activated on the time axis. For example, as described above with reference to FIG. 4, the signal generation circuit 14 may activate the fourth control signal CTR4 before the first control signal CTR1 is deactivated.

Figure 12:
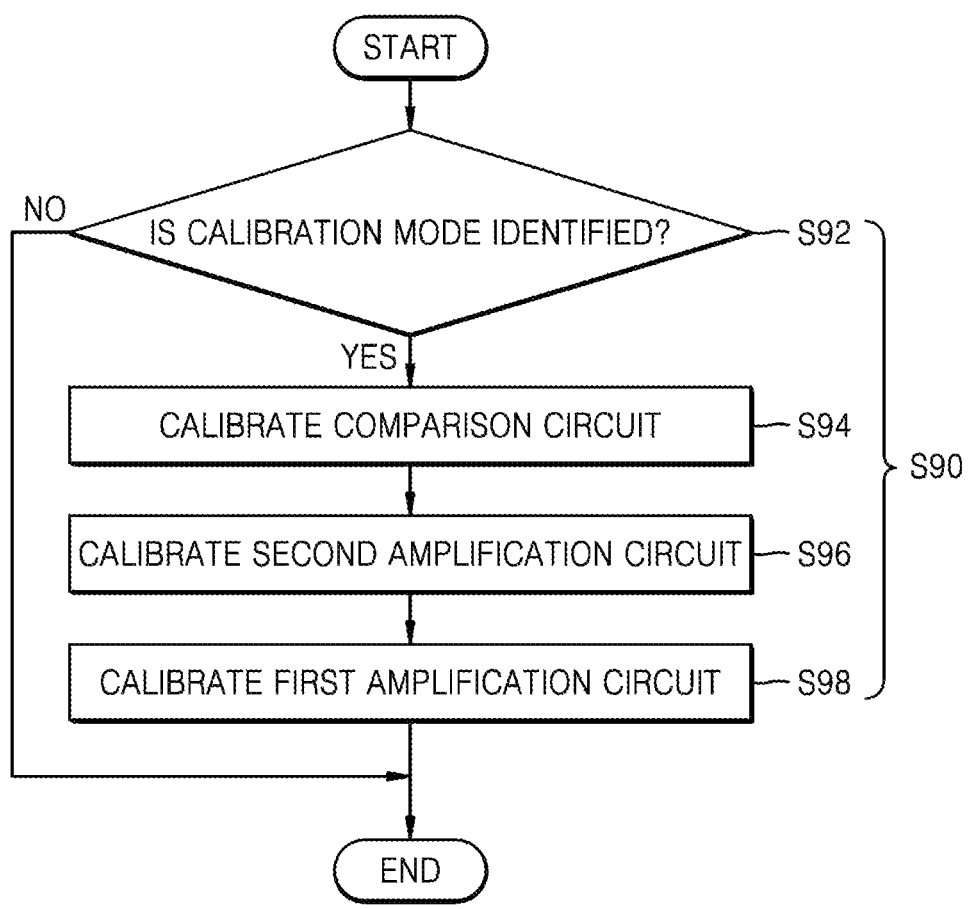
FIG. 12 is a flowchart of a method for analog-to-digital conversion, according to some example embodiments.

FIG. 12 is a flowchart of a method for analog-to-digital conversion, according to some example embodiments. In greater detail, FIG. 12 is a flowchart of operation S90 of calibrating an ADC. As shown in FIG. 12, operation S90 may include a plurality of operations S92, S94, S96, and S98. FIG. 12 is described herein with reference to FIGS. 5 and 6.

Referring to FIG. 12, a mode may be identified in operation S92. For example, as described above with reference to FIG. 6, the signal generation circuit 14 in FIG. 1 may receive the calibration enable signal CAL_EN and identify a calibration mode in response to the calibration enable signal CAL_EN that is activated. As shown in FIG. 12, when the calibration mode is identified, operation S94 may be subsequently performed.

A comparison circuit may be calibrated in operation S94. For example, as described above with reference to FIG. 6, the signal generation circuit 14 in FIG. 1 may generate the second control signal CTR2 that is deactivated and the fifth control signal CTR5 that is activated in the first interval P1. Accordingly, comparators (e.g., the first comparator 53_1 and the fifth comparator 53_5 in FIG. 5) of the comparison circuit may be calibrated in the first interval P1.

A second amplification circuit may be calibrated in operation S96. For example, as described above with reference to FIG. 6, in the second interval P2 following the first interval P1, the signal generation circuit 14 in FIG. 1 may generate the first control signal CTR1 that is deactivated, the second control signal CTR2 that is activated, the fifth control signal CTR5 that is deactivated, and the sixth control signal CTR6 that is activated. Accordingly, second amplifiers (e.g., the second amplifiers 52_1 and 52_3) of the second amplification circuit may be calibrated in the second interval P2.

A first amplification circuit may be calibrated in operation S98. For example, as described above with reference to FIG. 6, in the third interval P3 following the second interval P2, the signal generation circuit 14 in FIG. 1 may generate the first control signal CTR1 that is activated, the second control signal CTR2 that is activated, the fifth control signal CTR5 that is deactivated, the sixth control signal CTR6 that is deactivated, the seventh control signal CTR7 that is activated, and the eighth control signal CTR8 that is deactivated. Accordingly, first amplifiers (e.g., the first amplifiers 51_1 and 51_2) of the first amplification circuit may be calibrated in the third interval P3.

Figure 13:
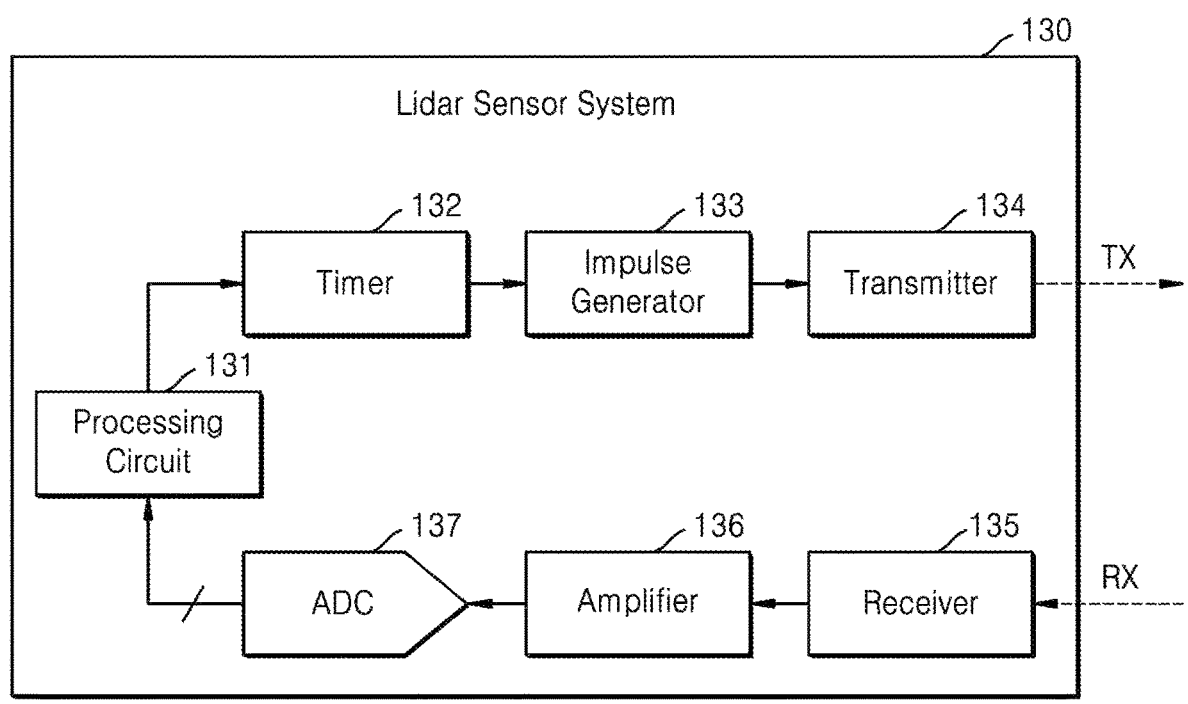
FIG. 13 is a block diagram of a system including an ADC, according to some example embodiments.

FIG. 13 is a block diagram of a system including an ADC, according to some example embodiments. In detail, the block diagram of FIG. 13 illustrates a light detection and ranging (LiDAR) sensor system 130 as an example of the system that includes the ADC. The LiDAR sensor system 130 may be used for various applications and may be used to detect an object outside, for example, an autonomous vehicle. As shown in FIG. 13, the LiDAR sensor system 130 may include a processing circuit 131, a timer 132, an impulse generator 133, a transmitter 134, a receiver 135, an amplifier 136, and an ADC 137.

The processing circuit 131 may control the timer 132 and process a digital signal provided from the ADC 137. For example, the processing circuit 131 may detect a distance to an external object or the like by analyzing the digital signal, which is provided from the ADC 137, based on settings of the timer 132. In some embodiments, the processing circuit 131 may include at least one selected from a programmable element, such as a central processing unit (CPU), a digital signal processor (DSP), or a graphics processing unit (GPU), a reconfigurable element, such as a field programmable gate array (FPGA), and/or a fixed function element, such as an intellectual property (IP) core, without being limited thereto.

The timer 132 may generate a signal under control by the processing circuit 131. For example, the timer 132 may generate a signal that oscillates with a period set by the processing circuit 131. The impulse generator 133 may generate an impulse in response to a signal provided from the timer 132. The transmitter 134 may output a transmission signal TX to the outside of the LiDAR sensor system 130 in response to the impulse. In some embodiments, the transmission signal TX may include a laser signal, and the transmitter 134 may include a laser diode that converts an electrical signal into a laser signal.

The receiver 135 may receive a reception signal RX from the outside of the LiDAR sensor system 130. For example, the receiver 135 may receive the reception signal RX, which results from the transmission signal TX being reflected from or by an external object. In some embodiments, the receiver 135 may include a photodiode and may convert the reception signal RX into an electrical signal. The amplifier 136 may amplify a signal from the receiver 135 and provide the amplified signal to the ADC 137.

The ADC 137 may convert a signal from the amplifier 136 into a digital signal. As described above with reference to the drawings, the ADC 137 may have a low input capacitance and thus reduce distortion in a signal output by the amplifier 136. In addition, the ADC 137 may have a high sampling frequency, thereby enabling the processing circuit 131 to readily detect an external object and increase a response speed of the LiDAR sensor system 130. As a result, the ADC 137 may improve the performance of applications, such as autonomous vehicles.

While the inventive concepts have been particularly shown and described with reference to some examples of embodiments thereof, it will be understood that various changes in form and details may be made therein without departing from the scope of the following claims.

What is claimed is:

1. An apparatus configured to convert an analog input signal into a digital output signal, the apparatus comprising:
   a first amplification circuit configured to receive the analog input signal and a plurality of reference voltages and configured to amplify differences between the analog input signal and the plurality of reference voltages;
   a plurality of first capacitors configured to respectively store charges corresponding to signals outputted by the first amplification circuit;
   a second amplification circuit configured to amplify differences among voltages of the plurality of first capacitors;
   a plurality of second capacitors configured to respectively store charges corresponding to signals outputted by the second amplification circuit;
   a comparison circuit configured to generate the digital output signal by comparing voltages of the plurality of second capacitors with each other;
   a signal generation circuit configured to generate a first control signal and a second control signal, based on a clock signal, the first and second control signals exclusively activated at different times;
   a plurality of first switches configured to electrically connect the first amplification circuit to the plurality of first capacitors in response to the first control signal being activated; and
   a plurality of second switches configured to electrically connect the second amplification circuit to the plurality of second capacitors in response to the second control signal being activated.

2. The apparatus of claim 1, further comprising:
   a plurality of third switches configured to electrically connect the plurality of first capacitors with a reset voltage source in response to a third control signal being activated; and
   a plurality of fourth switches configured to electrically connect the plurality of second capacitors with the reset voltage source in response to a fourth control signal being activated,
   wherein the signal generation circuit is further configured to generate the third and fourth control signals, based on the clock signal, the third and fourth control signals exclusively activated at different times.

3. The apparatus of claim 2, wherein the first and third control signals are exclusively activated at different times and the second and fourth control signals are exclusively activated at different times.

4. The apparatus of claim 1, wherein the signal generation circuit is further configured to activate the first and second control signals during different portions of a single period of the clock signal.

5. The apparatus of claim 1, wherein the first amplification circuit is further configured to precharge outputs thereof in response to the first control signal being deactivated, and
   the second amplification circuit is further configured to precharge outputs thereof in response to the second control signal being deactivated.

6. The apparatus of claim 1, wherein the digital output signal includes $2^N+1$ bits, where N is an integer that is greater than 1,
wherein the comparison circuit includes $2^N+1$ comparators,
wherein the second amplification circuit includes $2^{N-1}+1$ second amplifiers connected to the comparison circuit through the plurality of second switches, and
wherein the first amplification circuit includes $2^{N-2}+1$ first amplifiers connected to the second amplification circuit through the plurality of first switches.

7. The apparatus of claim 6, further comprising a plurality of fifth switches configured to apply a calibration voltage to inputs of $2^{N-2}+1$ comparators in a first interval of a calibration mode, the $2^{N-2}+1$ comparators respectively corresponding to $2^{N-2}+1$ first amplifiers among the $2^N+1$ first amplifiers.

8. The apparatus of claim 7, further comprising a plurality of sixth switches configured to apply the calibration voltage to inputs of $2^{N-2}+1$ second amplifiers in a second interval of the calibration mode following the first interval of the calibration mode, the $2^{N-2}+1$ second amplifiers respectively corresponding to the $2^{N-2}+1$ first amplifiers among the $2^N+1$ first amplifiers.

9. The apparatus of claim 8, further comprising a plurality of seventh switches configured to apply the calibration voltage to inputs of the $2^{N-2}+1$ first amplifiers in a third interval of the calibration mode following the second interval of the calibration mode.

10. The apparatus of claim 9, wherein each of the $2^{N-2}+1$ first amplifiers includes:
a first transistor configured to receive the analog input signal;
a plurality of second transistors configured to receive in common one of the plurality of reference voltages; and
a plurality of third transistors respectively connected to the plurality of second transistors and configured to respectively receive bits of a calibration signal.

11. An apparatus configured to convert an analog input signal into a digital output signal, the apparatus comprising:
a first amplification circuit configured to amplify differences between the analog input signal and a plurality of reference voltages during a first phase of a clock signal;
a second amplification circuit configured to amplify differences among signals outputted by the first amplification circuit during a second phase of the clock signal; and
a comparison circuit configured to generate the digital output signal by comparing signals outputted by the second amplification circuit with each other during the first phase of the clock signal.

12. The apparatus of claim 11, further comprising:
a plurality of first capacitors configured to store, during the second phase of the clock signal, charges corresponding to outputs of the first amplification circuit; and
a plurality of second capacitors configured to store, during the first phase of the clock signal, charges corresponding to outputs of the second amplification circuit.

13. The apparatus of claim 12, wherein the plurality of first capacitors are further configured to be connected with a reset voltage source before the second phase of the clock signal, and the plurality of second capacitors are further configured to be connected with the reset voltage source before the first phase of the clock signal.

14. The apparatus of claim 11, wherein the first amplification circuit is further configured to precharge outputs thereof before the first phase of the clock signal, and
the second amplification circuit is further configured to precharge outputs thereof before the second phase of the clock signal.

15. A method of converting an analog input signal into a digital output signal, the method comprising:
receiving the analog input signal and a plurality of reference voltages;
generating first output signals by amplifying differences between the analog input signal and the plurality of reference voltages;
storing charges corresponding to the first output signals in a plurality of first capacitors;
generating second output signals by amplifying differences among voltages of the plurality of first capacitors;
storing charges corresponding to the second output signals in a plurality of second capacitors;
generating the digital output signal by comparing voltages of the plurality of second capacitors with each other;
calibrating the generating of the digital output signal in a first interval of a calibration mode;
calibrating the generating of the second output signals in a second interval of the calibration mode following the first interval of the calibration mode; and
calibrating the generating of the first output signals in a third interval of the calibration mode following the second interval of the calibration mode.

16. The method of claim 15, further comprising generating a first control signal and a second control signal based on a clock signal, the first and second control signals exclusively activated at different times,
wherein the generating of the first output signals and the storing of the charges in the plurality of first capacitors are performed in response to the first control signal being activated, and
wherein the generating of the second output signals and the storing of the charges in the plurality of second capacitors are performed in response to the second control signal being activated.

17. The method of claim 16, wherein the generating of the first control signal and the second control signal includes separately activating the first control signal and the second control signal during different portions of a single period of the clock signal.

18. The method of claim 16, further comprising:
generating a third control signal and a fourth control signal based on the clock signal, the third and fourth control signals exclusively activated at different times;
charging the plurality of first capacitors with a reset voltage in response to the third control signal being activated; and
charging the plurality of second capacitors with the reset voltage in response to the fourth control signal being activated.

* * * * *